US008650891B2

(12) United States Patent
Jonsson et al.

(10) Patent No.: US 8,650,891 B2
(45) Date of Patent: Feb. 18, 2014

(54) HEAT TRANSFER ARRANGEMENT AND ELECTRONIC HOUSING COMPRISING A HEAT TRANSFER ARRANGEMENT AND METHOD OF CONTROLLING HEAT TRANSFER

(75) Inventors: Fredrik Jonsson, Bro (SE); Klas Hedberg, Huddinge (SE); Magnus Källmark, Stockholm (SE)

(73) Assignee: Telefonaktiebolaget L M Ericsson (publ), Stockholm (SE)

( * ) Notice: Subject to any disclaimer, the term of this patent is extended or adjusted under 35 U.S.C. 154(b) by 297 days.

(21) Appl. No.: 13/264,253

(22) PCT Filed: Apr. 16, 2009

(86) PCT No.: PCT/SE2009/050390
§ 371 (c)(1),
(2), (4) Date: Oct. 13, 2011

(87) PCT Pub. No.: WO2010/120220
PCT Pub. Date: Oct. 21, 2010

(65) Prior Publication Data
US 2012/0031123 A1  Feb. 9, 2012

(51) Int. Cl.
*F25D 15/00* (2006.01)

(52) U.S. Cl.
USPC .......................................................... 62/119

(58) Field of Classification Search
USPC ............... 62/119, 259.2, 6; 165/80.2, 104.33; 361/679.52, 696
See application file for complete search history.

(56) References Cited

U.S. PATENT DOCUMENTS

| 1,719,208 | A | * | 7/1929 | Brockett ......................... 62/146 |
| 4,756,164 | A | * | 7/1988 | James et al. ..................... 62/119 |
| 4,766,885 | A | * | 8/1988 | Muramatsu .................... 126/636 |
| 5,076,351 | A | * | 12/1991 | Munekawa et al. ...... 165/104.21 |
| 5,257,660 | A | * | 11/1993 | Cargile .................... 165/104.22 |
| 5,467,600 | A | * | 11/1995 | Kuroiwa ............................. 62/6 |
| 5,725,049 | A | * | 3/1998 | Swanson et al. .......... 165/104.26 |

(Continued)

FOREIGN PATENT DOCUMENTS

| GB | 2003596 A | 3/1979 |
| JP | 2001035980 A | 2/2001 |

(Continued)

*Primary Examiner* — Mohammad M Ali
(74) *Attorney, Agent, or Firm* — Coats and Bennett PLLC

(57) ABSTRACT

A heat transfer arrangement (100) comprises a refrigerant circuit (102), which refrigerant circuit (102) comprises an evaporator (104) adapted to be arranged inside an electronic component housing (112), a condenser (108) adapted to be arranged outside the electronic component housing (112), a first conduit (106) and a second conduit (110). A refrigerant is present in the refrigerant circuit (102) and in use is arranged to self-circulate by evaporating in the evaporator (104), rising as a gas through the first conduit (106), condensing in the condenser (108) and flowing through the second conduit (110) to the evaporator (104). The heat transfer arrangement (100) further comprises a reservoir (124) for liquid refrigerant connected to the refrigerant circuit (102). A control device associated with the reservoir (124) is operable such that liquid refrigerant is collected in the reservoir (124) from the refrigerant circuit (102) to reduce heat exchange from the inside of the electronic component housing (112) to the ambient environment and such that liquid refrigerant is introduced from the reservoir (124) to the refrigerant circuit to increase heat exchange from the inside of the electronic component housing (112) to ambient environment.

17 Claims, 3 Drawing Sheets

(56) References Cited

U.S. PATENT DOCUMENTS

| | | | |
|---|---|---|---|
| 6,050,327 A * | 4/2000 | Gates | 165/80.3 |
| 6,062,299 A * | 5/2000 | Choo et al. | 165/46 |
| 6,209,625 B1 * | 4/2001 | Guo | 165/104.21 |
| 6,282,913 B1 * | 9/2001 | Moriguchi et al. | 62/259.2 |
| 6,377,452 B1 * | 4/2002 | Sasaki et al. | 361/679.47 |
| 6,698,502 B1 | 3/2004 | Lee | |
| 6,755,026 B2 * | 6/2004 | Wallach | 62/3.7 |
| 6,880,626 B2 * | 4/2005 | Lindemuth et al. | 165/104.26 |
| 7,004,240 B1 * | 2/2006 | Kroliczek et al. | 165/104.26 |
| 7,185,512 B2 * | 3/2007 | Badie et al. | 62/515 |
| 7,251,889 B2 * | 8/2007 | Kroliczek et al. | 29/890.07 |
| 7,305,843 B2 * | 12/2007 | Quisenberry et al. | 62/259.2 |
| 2009/0000332 A1 | 1/2009 | Kondo et al. | |

FOREIGN PATENT DOCUMENTS

| | | |
|---|---|---|
| JP | 2008235565 A | 10/2008 |
| JP | 2008311501 A | 12/2008 |
| WO | 99/30091 | 6/1999 |
| WO | 00/70289 | 11/2000 |

* cited by examiner

HEAT TRANSFER ARRANGEMENT AND ELECTRONIC HOUSING COMPRISING A HEAT TRANSFER ARRANGEMENT AND METHOD OF CONTROLLING HEAT TRANSFER

TECHNICAL FIELD

The present invention relates to a heat transfer arrangement comprising a refrigerant circuit. In use a refrigerant is arranged to self-circulate in the refrigerant circuit. The invention also relates to an electronic component housing comprising such a heat transfer arrangement and a method of controlling heat transfer from an inside of such an electronic component housing.

BACKGROUND

Heat transfer systems utilizing a refrigerant circulating through an evaporator and a condenser are well known. A heat transfer system wherein the refrigerant self-circulates, i.e. gravity and buoyancy are forces driving the circulation of the refrigerant, is sometimes referred to as a thermosiphon.

Many electronic component housings need to be cooled due to the heat generated by the electronic components inside the housing. A cooling fan directing air through the housing is sufficient for some applications and/or under certain operating conditions. For other applications a heat transfer system utilizing a refrigerant, which evaporates in an evaporator and condenses in a condenser, might be required. In such a system the evaporator is arranged to cool the electronic components by using heat from the electronic components to evaporate the refrigerant.

WO99/60709 discloses a method and an apparatus for cooling electronic components of radio base stations installed at elevated locations. An evaporator of a thermosiphon cooling system is in thermal contact with heat-generating electronic components to be cooled. A condenser of the thermosiphon cooling system is arranged above the evaporator. The condenser is constructed and arranged for natural convection of ambient air.

Generally, a modern radio communication system comprises a radio access network and a number of communication devices. The radio access network is built up of several nodes, in particular, radio base stations. The primary task of a radio base station is to send and receive information to/from the communication devices within a cell served by the radio base station. In many cases, the base station is run 24 hours a day. Therefore, it is of particular interest and importance to ensure that the base station is operable predictably and reliably. The radio base station comprises an electronic component housing. Inside the electronic component housing there are arranged electronic components and circuitry for performing different tasks of the radio base station. For example, the circuitry may comprise a power control unit, a radio unit comprising a radio amplifier, and a filtering unit for performing corresponding tasks.

Heat generated in the circuitry of the base station, in particular the radio unit, may not always dissipate naturally to a sufficiently high degree. Instead, heat is accumulated in the circuitry and the temperature of the circuitry increases. The increased temperature of the circuitry may impair the performance of circuitry within the radio base station. Consequently, unpredicted interruptions in operation of the base station may occur.

This is clearly not desired and a thermosiphon cooling system as disclosed in WO99/60709, mentioned above, could be used to cool the electronic component housing. WO99/60709 does however not disclose how cooling may be controlled in a thermosiphon cooling system. Under certain conditions it is namely desirable to not cool the electronic component housing in order to avoid a too low temperature inside the electronic component housing, which also could harm the electronic components and circuitry inside the electronic component housing.

WO99/30091 discloses a cooling capacity control for a thermosiphon system. The thermosiphon system has a refrigerant circuit, to which there is connected a branch pipe leading to a container. The container is in some situations filled with refrigerant and in other situations it is empty, the refrigerant having been transferred through the branch pipe to the refrigerant circuit. The amount of refrigerant in the container, and thus the cooling capacity of the thermosiphon system, is controlled by means of a heater. When high cooling capacity is required from the thermosiphon system, the container is not heated. Thus the container remains filled with refrigerant. When less cooling capacity is required, the container is heated such that some of the refrigerant boils. Liquid refrigerant is expelled from the container by the gas pressure in the container. The refrigerant circuit is flooded with liquid refrigerant and thereby the cooling capacity of the thermosiphon system is reduced.

SUMMARY

An object of the present invention is to obviate one or more of the above disadvantages and provide an improved heat transfer arrangement with a refrigerant arranged to self-circulate.

According to an aspect of the invention, the object is achieved by a heat transfer arrangement for heat exchange between an inside of an electronic component housing and an ambient environment. The heat transfer arrangement comprises a refrigerant circuit, which refrigerant circuit comprises an evaporator adapted to be arranged inside the electronic component housing, a condenser adapted to be arranged outside the electronic component housing, a first conduit leading from the evaporator to the condenser, and a second conduit leading from the condenser to the evaporator. A refrigerant is present in the refrigerant circuit and in use is arranged to self-circulate in the refrigerant circuit by evaporating in the evaporator, rising as a gas through the first conduit, condensing in the condenser and flowing through the second conduit to the evaporator. The heat transfer arrangement further comprises a reservoir for liquid refrigerant connected to the refrigerant circuit. The heat transfer arrangement further comprises a control device associated with the reservoir. The control device is arranged to collect liquid refrigerant in the reservoir from the refrigerant circuit to thereby reduce heat exchange from the inside of the electronic component housing to the ambient environment and to introduce liquid refrigerant from the reservoir to the refrigerant circuit to thereby increase heat exchange from the inside of the electronic component housing to the ambient environment.

The heat transfer arrangement and in particular the refrigerant circuit thereof is designed for a maximum cooling capacity, which is required to provide adequate cooling of the inside of the electronic component housing. The maximum cooling capacity is required under conditions when much heat is generated by electronic components inside the electronic component housing and the ambient environment surrounding the electronic component housing is unfavourable, e.g. when ambient temperature is high. For this maximum cooling capacity a specific amount of refrigerant self-circulates inside the refrigerant circuit.

Since the control device adjusts the amount of refrigerant inside the refrigerant circuit, the capacity of the heat transfer arrangement is controlled depending on the amount of refrigerant circulating inside the refrigerant circuit. The less cooling of the inside of the electronic component housing is required, the more liquid refrigerant is collected in the reservoir for liquid refrigerant. Eventually no refrigerant or only minor amounts of refrigerant, insufficient for providing any relevant cooling capacity, remain inside the refrigerant circuit. When the need for heat transfer from the inside of the electronic component housing increases, liquid refrigerant from the reservoir is introduced into the refrigerant circuit to provide adequate cooling of the inside of the electronic component housing. Collecting and introducing of the liquid refrigerant is controlled by means of the control device.

As a result, the above mentioned object is achieved.

According to example embodiments, the reservoir for liquid refrigerant may be directly or via a connecting conduit connected to the condenser or to the second conduit or to the evaporator. Thus it is ensured that only liquid refrigerant is collected inside the reservoir. Furthermore, by providing a dedicated connection to the refrigerant circuit, the control device may have optimal control over the amount of liquid refrigerant in the reservoir.

According to example embodiments the reservoir may comprise a refrigerant chamber forming part of the control device which may be adapted to adjust a size of the refrigerant chamber to accommodate different amounts of liquid refrigerant. A refrigerant chamber, which may be adjusted in size, is an easily operable and exact device for controlling the amount of liquid refrigerant collected in the reservoir from the refrigerant circuit. The control device may comprise a piston or a membrane adapted to adjust the size of the refrigerant chamber.

According to example embodiments the control device may comprise a control chamber of variable size enclosing a control medium, the size of the control chamber affecting the size of the refrigerant chamber. A control medium expanding and contracting inside the control chamber in dependence of for instance a temperature inside the electronic component housing is a convenient manner of ensuring that the right amount of refrigerant is present in the refrigerant circuit. No additional electronic control circuitry for controlling the size of the refrigerant chamber is required. Once manufactured and installed, the heat transfer arrangement with the control chamber and control medium is essentially maintenance free and will operate under all relevant operating conditions to which the electronic component housing is subjected. The refrigerant chamber may be separated from the control chamber by means of the piston or the membrane. The size of the control chamber will in this manner directly affect the size of the refrigerant chamber. Alternatively, the control chamber size affects the refrigerant chamber size in an indirect way, e.g. by system of interconnected pistons and/or additional chambers.

According to example embodiments, the control medium may be a liquid, such as an alcohol e.g. ethanol, or oil. The liquid should remain in liquid phase over the entire relevant temperature interval that the inside of the electronic component housing is subjected to during operation. In addition or alternatively it is foreseeable that the liquid may remain in liquid phase at temperatures that the electronic component housing might be subjected to during installation thereof or before electronic components inside the electronic component housing start generating heat. It is also foreseeable that the liquid control medium transforms to solid phase below the relevant temperature interval that the inside of the electronic component housing is subjected to during operation. No further volume change of the refrigerant chamber is required below this temperature range.

According to example embodiments the control medium may be wax. The wax may be in solid (wax) phase at a low temperature within the relevant temperature interval occurring inside the electronic component housing during its operation, and which will change to liquid phase within the temperature interval occurring inside the electronic component housing during its operation.

According to example embodiments the control medium may be a gas, such as nitrogen, air or an inert gas, e.g. argon. The gas should remain in gaseous phase over the entire relevant temperature interval that the inside of the electronic component housing is subjected to during operation. In addition or alternatively it is foreseeable that the gas may remain in gaseous phase at temperatures that the electronic component housing might be subjected to during installation thereof or before electronic components inside the electronic component housing start generating heat.

According to example embodiments the reservoir for liquid refrigerant may be directly or via a dedicated connecting conduit connected to a lower end of the condenser. As long as there is any substantial amount of refrigerant inside the refrigerant circuit, in this location it is ensured that it will be easily collected.

According to a further aspect of the invention an electronic component housing may comprise a heat transfer arrangement as discussed above.

According to example embodiments the electronic component housing may form part of a radio base station.

According to example embodiments the reservoir for liquid refrigerant may be arranged inside the electronic component housing. A change in temperature inside the electronic component housing will immediately affect the reservoir. In case a control medium is present in the reservoir, it will directly respond to the temperature change and collect liquid refrigerant form the refrigerant circuit or introduce liquid refrigerant to the refrigerant circuit, as the case may be.

According to example embodiments the control chamber may be in thermal contact with the inside of the electronic component housing to adjust the size of the control chamber depending on a temperature inside the electronic component housing. Again, in case a control medium is present in the reservoir, it will respond to the temperature change and adjust the size of the control chamber to collect liquid refrigerant from the refrigerant circuit or introduce liquid refrigerant to the refrigerant circuit, as the case may be.

According to a still further aspect of the invention a method of controlling a heat transfer arrangement for heat exchange from an inside of an electronic component housing to an ambient environment, comprises the steps of
    self-circulating the refrigerant in the refrigerant circuit by evaporating in the evaporator, rising as a gas through the first conduit, condensing in the condenser and flowing through the second conduit to the evaporator,
    collecting liquid refrigerant in the reservoir from the refrigerant circuit to reduce heat exchange from the inside of the electronic component housing to the ambient environment, and
    introducing liquid refrigerant from the reservoir to the refrigerant circuit to increase heat exchange from the inside of the electronic component housing to the ambient environment.

In example embodiments the method of controlling heat transfer and the steps of collecting liquid refrigerant in the reservoir from the refrigerant circuit and introducing liquid refrigerant from the reservoir to the refrigerant circuit includes adjusting the size of a refrigerant chamber in the reservoir to accommodate different amounts of liquid refrigerant, such that when collecting liquid refrigerant from the refrigerant circuit the size of the refrigerant chamber is increased and when introducing liquid refrigerant to the refrigerant circuit the size of the refrigerant chamber is reduced.

Further features of, and advantages with, the present invention will become apparent when studying the appended claims and the following description. Those skilled in the art will realize that different features of the present invention may be combined to create embodiments other than those described in the following, without departing from the scope of the present invention, as defined by the appended claims.

BRIEF DESCRIPTION OF THE DRAWINGS

The various aspects of the invention, including its particular features and advantages, will be readily understood from the following detailed description and the accompanying drawings, in which.

DETAILED DESCRIPTION

The present invention will now be described more fully with reference to the accompanying drawings, in which example embodiments are shown. However, this invention should not be construed as limited to the embodiments set forth herein. Disclosed features of example embodiments may be combined as readily understood by one of ordinary skill in the art to which this invention belongs. Like numbers refer to like elements throughout.

As used herein, the term "comprising" or "comprises" is open-ended, and includes one or more stated features, elements, steps, components or functions but does not preclude the presence or addition of one or more other features, elements, steps, components, functions or groups thereof.

As used herein, the term "and/or" includes any and all combinations of one or more of the associated listed items.

As used herein, the common abbreviation "e.g.", which derives from the Latin phrase "exempli gratia," may be used to introduce or specify a general example or examples of a previously mentioned item, and is not intended to be limiting of such item. If used herein, the common abbreviation "i.e.", which derives from the Latin phrase "id est," may be used to specify a particular item from a more general recitation.

The terminology used herein is for the purpose of describing particular embodiments only and is not intended to be limiting of the invention. As used herein, the singular forms "a", "an" and "the" are intended to include the plural forms as well, unless the context clearly indicates otherwise.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

It will be understood that when an element is referred to as being "coupled" or "connected" to another element, it can be directly coupled or connected to the other element or intervening elements may also be present. In contrast, when an element is referred to as being "directly coupled" or "directly connected" to another element, there are no intervening elements present.

Well-known functions or constructions may not be described in detail for brevity and/or clarity.

Figure 1:
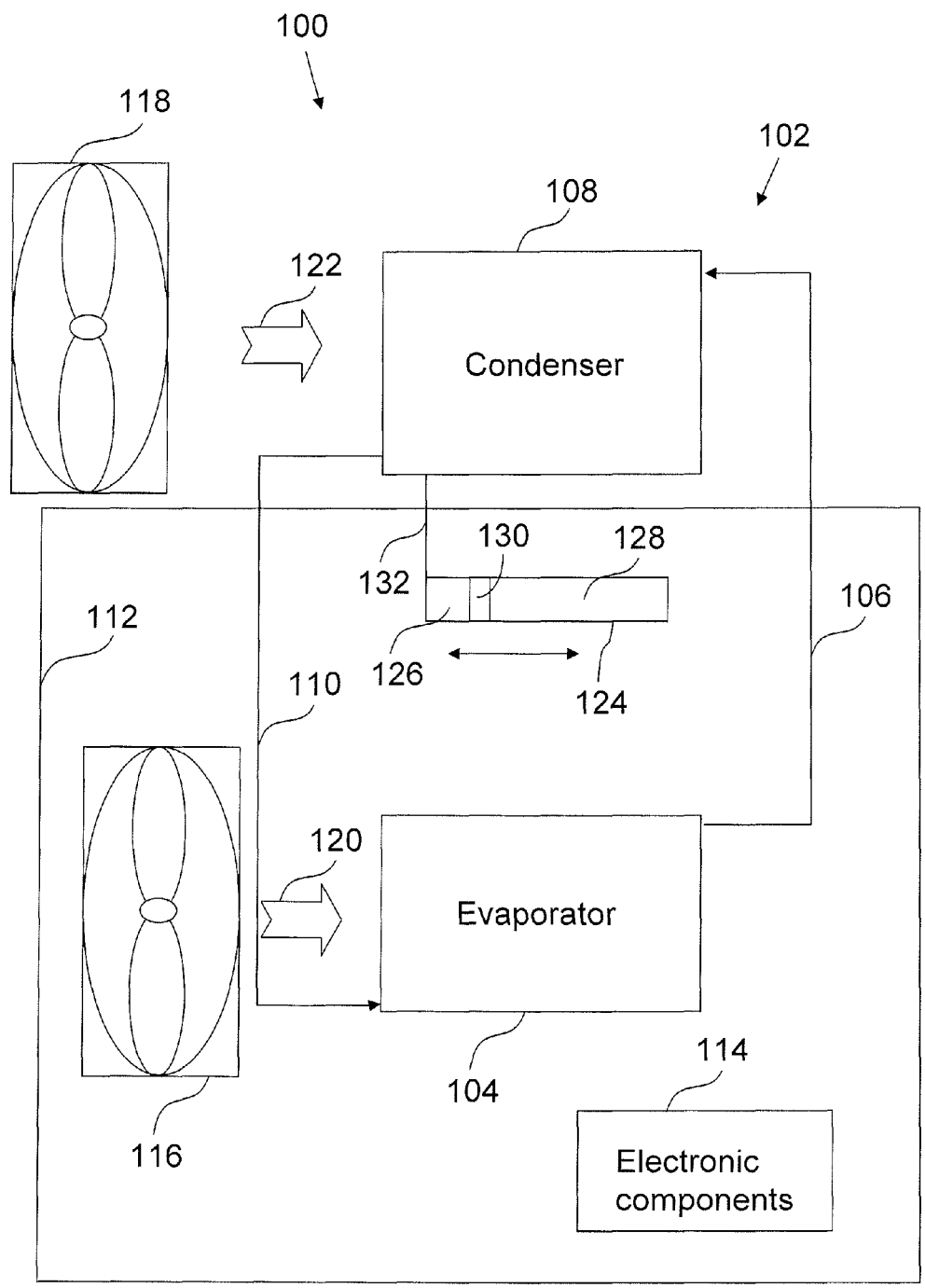
FIGS. 1 and 2 illustrate schematically heat transfer arrangements according to example embodiments.

FIG. 1 illustrates schematically a heat transfer arrangement 100 according to example embodiments. A refrigerant circuit 102 comprises an evaporator 104, a first conduit 106, a condenser 108 and a second conduit 110. Inside the refrigerant circuit 102 there is a refrigerant. Under certain conditions the refrigerant self-circulates in the refrigerant circuit 102. The refrigerant in liquid form evaporates inside the evaporator 104 and rises in gas form through the first conduit 106 to the condenser 108. Inside the condenser 108 the refrigerant in gas form condenses and flows in liquid form back to the evaporator 104 through the second conduit 110.

Gravity and buoyancy are forces driving the self-circulation. When the condenser 108 is arranged above the evaporator 104, as schematically shown, an efficient self-circulation of refrigerant takes place. Liquid refrigerant will not be collected to any substantial extent in the condenser 108 but will flow through the second conduit 110 down to the evaporator 104. Also in a refrigerant circuit with the evaporator and the condenser arranged laterally beside each other and with the first conduit arranged such that refrigerant in gas form can rise therein, a refrigerant may self-circulate. However, in this case liquid refrigerant would occupy part of the condenser, the condenser and evaporator being communicating vessels.

An electronic component housing 112 is adapted to house electronic components 114. In example embodiments the electronic component housing 112 may be a radio base station and the electronic components 114 may be part of devices associated with such a radio base station, e.g. a radio unit. The heat transfer arrangement 100 is adapted for heat exchange between an inside of the electronic component housing 112 and an ambient environment of the electronic component housing 112 and thus it is adapted to cool the electronic components 114. For this purpose the evaporator 104 of the refrigerant circuit 102 is arranged inside the electronic component housing 112. The condenser 108 is arranged outside the electronic component housing 112, where the refrigerant in gas form is cooled and condenses to flow back to the evaporator 104 through the second conduit 110.

Inside the electronic component housing 112 a first gas moving device, e.g. a first fan 116, is arranged and adapted to circulate a gas, commonly air, inside the electronic component housing 112. Outside the electronic component housing 112 a second gas moving device, e.g. a second fan 118, is arranged and adapted to blow ambient air over an outer surface area of the condenser 108. The condenser 108 and also the second fan 118 may be arranged in a non-shown separate housing. Suitably such a separate housing is in open communication with the ambient environment. To save vertical space inside the electronic component housing 112 the evaporator 104 may be arranged at an acute angle from a horizontal line, e.g. at 5-60 degrees. Also the condenser 108 may be arranged at an acute angle, at the same angle as the evaporator or at a different angle.

In use, the electronic components 114 inside the electronic component housing 112 generate heat. Depending inter alia on generated heat, construction of the electronic component housing 112 and on ambient conditions such as temperature, air movement (e.g. wind) and precipitation (e.g. rain), the temperature inside the electronic component housing 112 may increase to a level which could harm the electronic components 114. The heat transfer arrangement 100 and primarily the evaporator 104 of the refrigerant circuit 102 is arranged to cool the inside air of the electronic component housing 112 to avoid such harmful temperature levels. A suitable aim of example embodiments may be to keep the temperature inside the electronic component housing 112 below +60 degrees Celsius.

Under certain conditions the refrigerant self-circulates inside the refrigerant circuit 102 as explained above. By utilizing warm air inside the electronic component housing 112 for evaporating the refrigerant, the temperature of the air inside the electronic component housing 112 will fall and may be used for cooling the electronic components 114. Inter alia to ensure proper cooling of the electronic components 114, the first fan 116 may circulate the air, as indicated by arrow 120, inside the electronic component housing 112 past the evaporator 104 and the electronic components 114. Circulation in another direction than indicated by arrow 120 is also possible. In the condenser 108 the refrigerant in gas form will condense to liquid form by emitting heat to the ambient environment. Transfer of heat from the condenser 108 to the ambient environment may be increased by switching on the second fan 118 to blow ambient air over an outer surface area of the condenser 108, e.g. in the direction indicated by arrow 122.

It is also desirable to not allow the temperature inside the electronic component housing 112 to fall below a certain temperature. Too low a temperature could also harm the electronic components 114. Under certain conditions it is thus desired to reduce or even stop heat exchange, by means of the heat transfer arrangement 100, between the inside of the electronic component housing 112 and the ambient environment. A suitable aim may be to keep the temperature inside the electronic component housing 112 above +5 degrees Celsius.

To control the heat exchange of the heat transfer arrangement 100 there is connected a reservoir 124 for liquid refrigerant to the condenser 108 of the refrigerant circuit 102. The reservoir 124 is arranged inside the electronic component housing 112 and is thus directly affected by the temperature therein. In the reservoir 124 there is a refrigerant chamber 126 and a control chamber 128. The refrigerant chamber 126 and the control chamber 128 are separated by means of a movable partition, e.g. in the form of a piston 130. The refrigerant chamber 126 is connected to and communicates with the condenser 108 via a connecting conduit 132. The control chamber 128 is filled with a control medium, which takes up a smaller volume when it has a low temperature than when it has a high temperature. Such control media may be a liquid such as an alcohol or oil alternatively it may be a wax, which may change between a wax phase (solid/creamy) and a liquid phase. These control media are in the present context regarded to be incompressible and will thus move the piston 130 without being influenced by the pressure prevailing in the refrigerant circuit.

The refrigerant chamber 126, the control chamber 128, the movable piston 130 and the control medium form part of a control device. The refrigerant chamber 126 has a variable volume such that it contains different amounts of liquid refrigerant depending on the temperature inside the electronic component housing 112. The liquid refrigerant flows via the connecting conduit 132 back and forth between the refrigerant chamber 126 and a lower portion of the condenser 108 when the piston 130 is moved back and forth inside the reservoir 124 as affected by the control medium.

When the temperature of the medium inside the electronic component housing 112, commonly air, is high, e.g. around +60 degrees Celsius, the control medium is in an expanded state and the piston 130 is positioned in the reservoir 124 such that the control chamber 128 has a maximum size and the refrigerant chamber 126 has a minimum size. In this state there is essentially no liquid refrigerant in the reservoir 124. Thus all refrigerant is available to self-circulate in the refrigerant circuit 102 transferring heat from inside the electronic component housing 112 to the ambient environment. Conversely, when the temperature inside the electronic component housing 112 is low, e.g. around +5 degrees Celsius, the control medium is in a contracted state and the piston 130 is positioned in the reservoir 124 such that the control chamber 128 has a minimum size and the refrigerant chamber 126 has a maximum size. In this state the maximum amount of liquid refrigerant has been collected in the refrigerant chamber 126 and the amount of refrigerant in the refrigerant circuit 102 is small. Self-circulation and thus also heat exchange may have completely stopped but even if the remainder of refrigerant in the refrigerant circuit 102 self-circulates the amount of refrigerant circulating is so small that only very limited heat exchange takes place.

Figure 2:
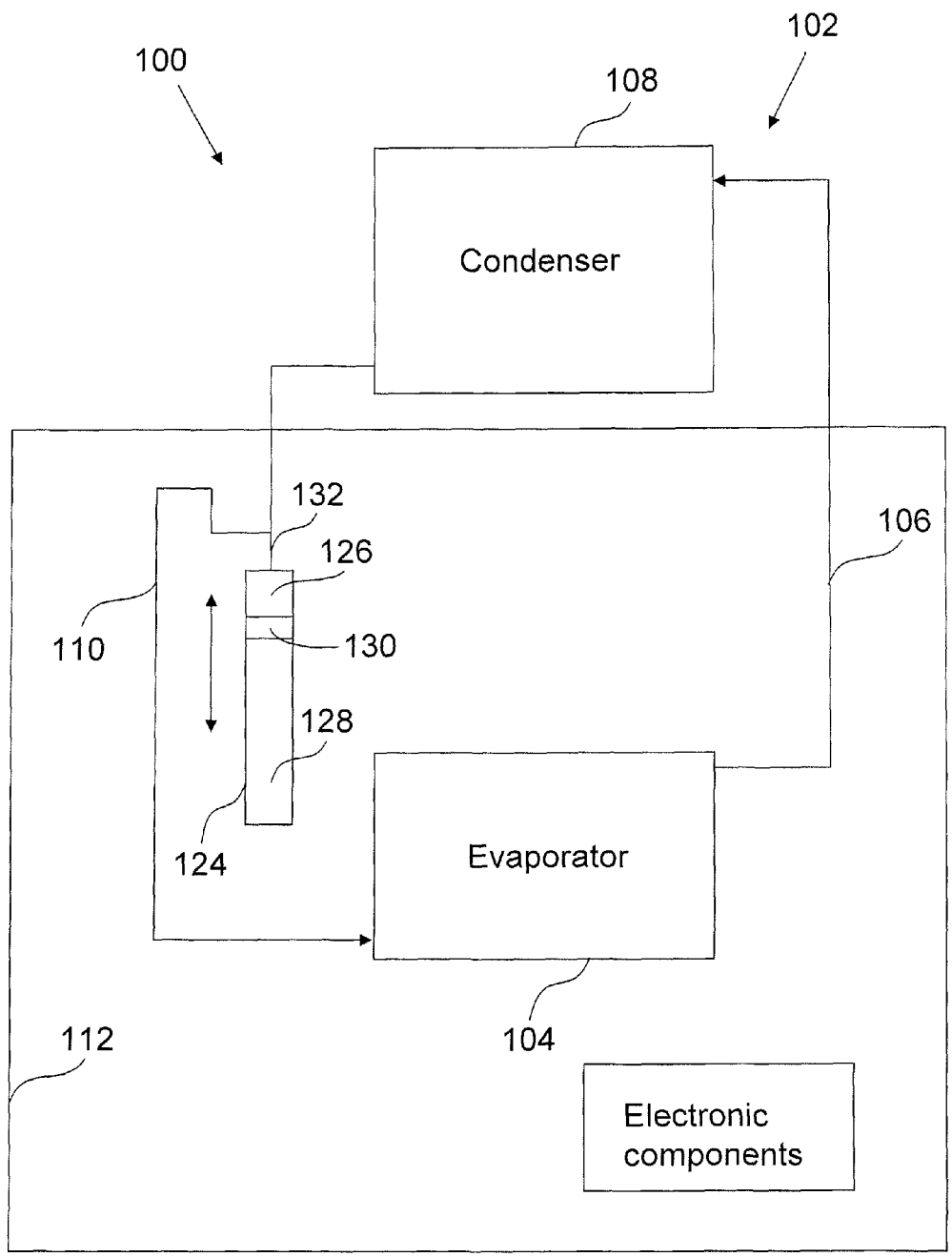

FIG. 2 illustrates schematically a heat transfer arrangement 100 for heat transfer from an electronic component housing 112 according to example embodiments. Parts of the heat transfer arrangement 100 have been omitted in FIG. 2. A reservoir 124 for liquid refrigerant is connected to a second conduit 110 connecting an outlet of a condenser 108 outside the electronic component housing 112 with an inlet of an evaporator 104 inside the electronic component housing 112. The reservoir 124 is connected to the second conduit 110 by means of a connecting conduit 132. To ensure safe liquid communication between the second conduit 110 and a refrigerant chamber 126 in the reservoir 124, the second conduit 110 diverts briefly in an upward direction where the connecting conduit 132 is connected to the second conduit 110. Such a brief diverting may not be required. In addition to the refrigerant chamber 126 the reservoir 124 has a control chamber 128 filled with a control medium. The two chambers 126, 128 are separated by a piston 130. Heat exchange between the inside of the electronic component housing is controlled as explained above in relation to FIG. 1.

Figure 3:
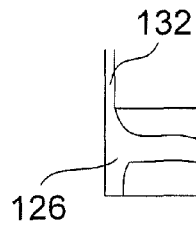
FIGS. 3 and 4 illustrate schematically reservoirs for liquid refrigerant according to example embodiments.

FIG. 3 illustrates schematically a reservoir 124 for liquid refrigerant according to example embodiments. The reservoir 124 has a refrigerant chamber 126 for liquid refrigerant and a control chamber 128 filled with a control medium. The two chambers 126, 128 are separated by means of a membrane 302. The refrigerant chamber 126, the control chamber 128, the membrane 302 and the control medium form part of a control device. By means of a connecting conduit 132 the refrigerant chamber 126 may be connected to a condenser or a second conduit for liquid refrigerant flowing from a condenser to an evaporator. Filling and emptying of the refrigerant chamber 126 with liquid refrigerant from a refrigerant circuit is controlled by the control medium contracting and expanding as explained above. Instead of a movable partition in the form of a piston, the membrane 302 is moved to change the size of the two chambers 126, 128 in the reservoir 124.

The pressure inside the refrigerant circuit depends on the temperature inside the electronic component housing and the ambient temperature. The pressure inside the refrigerant chamber 126 will be equal to the pressure inside the refrigerant circuit 102 to which it is connected. In example embodiments with liquid refrigerant on one side and the control medium on the other side of the movable partition, the pressure will be the same in both the refrigerant chamber 126 and the control chamber 128. A pressure change in one chamber will lead to the movable partition adapting a new position in which a new equilibrium pressure is reached. Because the pressure is the same on both sides of the movable partition there are no forces affecting the movable partition when there is equilibrium pressure in the refrigerant circuit 102, the refrigerant chamber 126 and the control chamber 128. This means that sealing of the piston 130 against inner walls of the reservoir 124 is simple and that the membrane 302 does not need to withstand high forces.

Figure 4:
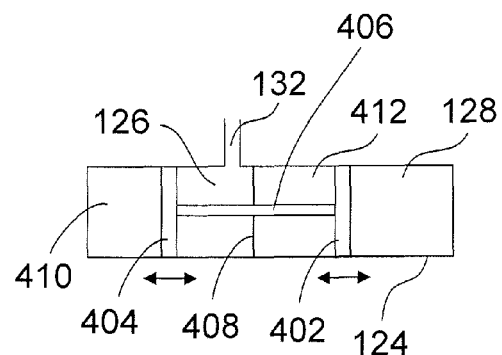

FIG. 4 schematically illustrates a reservoir 124 according to example embodiments. The reservoir 124 comprises a control chamber 128 filled with a control medium in the form of a gas, e.g. nitrogen or air. As will be explained below, a gas used as control medium in the reservoir 124 will have a smaller volume at a high temperature inside a connected refrigerant circuit than at a low temperature inside the refrigerant circuit. The control chamber 128 is delimited by a first piston 402. The first piston 402 forms part of a movable piston arrangement, which further comprises a second piston 404 and a connecting rod 406. The reservoir 124 further comprises a refrigerant chamber 126 for liquid refrigerant communicating with the refrigerant circuit via a connecting conduit 132. The refrigerant chamber 126 is delimited by the movable second piston 404 and a fixed wall 408. The refrigerant chamber 126, the control chamber 128, the control medium and the piston arrangement form part of a control device.

The pressure inside the refrigerant circuit depends on the temperature, or mean temperature, inside the refrigerant circuit. In the refrigerant circuit there will always be saturation pressure because there is refrigerant in both gas form and liquid form inside the refrigerant circuit. If the refrigerant inside the refrigerant circuit is for example R134a the saturation pressure and thus also the pressure inside the refrigerant circuit, will be 0.293 MPa at 0 degrees Celsius and 1.160 MPa at 45 degrees Celsius. As explained above the pressure inside the refrigerant chamber 126 is the same as inside the refrigerant circuit 102 and the pressure inside the control chamber 128 is the same as in the refrigerant chamber 126. The same applies here because of the movable piston arrangement transferring the pressure from the refrigerant chamber 126 to the control chamber 128.

For an ideal gas:

$$\text{Pressure} \times \text{Specific Volume} = R \times \text{Temperature}$$

R is a constant, 297 Nm/kgKelvin for nitrogen (approximated to be equivalent to an ideal gas) and the temperature is given in Kelvin. (For other gases other relationships exist, e.g. Van der Waals equation.) Following the above relationship the specific volume for nitrogen is 0.277 cubic meters per kilogram at 0 degrees Celsius and 0.293 MPa and the specific volume for nitrogen is 0.081 cubic meters per kilogram at 45 degrees Celsius and 1.160 MPa. This means that the volume of the control chamber 128 decreases with increasing temperature and increasing pressure. Accordingly, and since the refrigerant chamber 126 is formed between the second piston 404 and the fixed wall 408, the volume of the refrigerant chamber 126 will increase as the temperature falls and the volume of the control chamber 128 increases. Conversely, the volume of the refrigerant chamber 126 will decrease as the temperature rises and the volume of the control chamber 128 decreases.

The reservoir 124 furthermore comprises a first compartment 410 and a second compartment 412. One or both of the compartments 410, 412 may be filled with a medium which will aid in providing necessary piston arrangement movements, e.g. a refrigerant in liquid and gas phase such that saturation pressure always will prevail in the compartments 410, 412.

Figure 5:
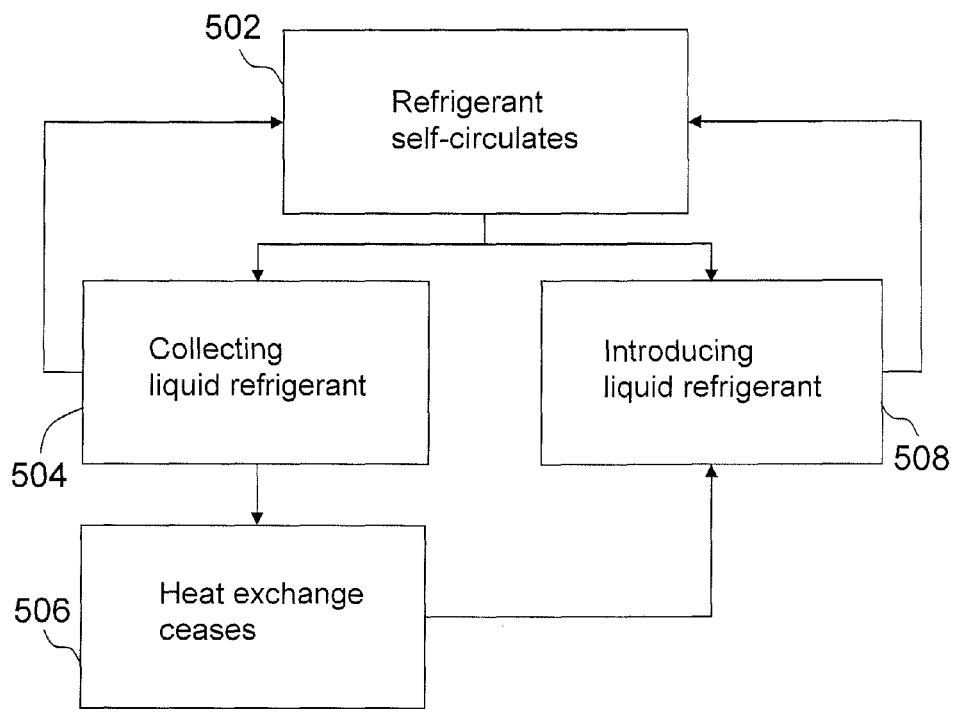
FIG. 5 illustrates schematically a method of controlling a heat transfer arrangement according to example embodiments.

FIG. 5 illustrates schematically a method of controlling a heat transfer arrangement for heat exchange between an inside of an electronic component housing and an ambient environment according to example embodiments. At position 502 a general cooling need of the inside of the electronic component housing exists and refrigerant self-circulates inside a refrigerant circuit of the heat transfer arrangement. Heat exchange takes place between an inside of the electronic component housing and the environment. At position 504 the cooling need inside the electronic component housing is reduced and some of the liquid refrigerant is collected from the refrigerant circuit into a reservoir for liquid refrigerant. Remaining refrigerant in the refrigerant circuit continues to circulate, position 502. If the cooling need is further reduced more liquid refrigerant is collected, position 504. As cooling need is further reduced at position 506 heat exchange by means of the heat transfer arrangement essentially ceases. At position 508 the cooling need inside the electronic component housing increases and liquid refrigerant is introduced to the refrigerant circuit from the reservoir. Position 508 can be reached either from an essentially ceased heat exchange, position 506, or from a general cooling need at position 502 that needs to be increased. Back at position 502 the new amount of refrigerant inside the refrigerant circuit self-circulate.

Utilizing a heat transfer arrangement with a reservoir for liquid refrigerant connected to the condenser or a second conduit with liquid refrigerant of a refrigerant circuit, the temperature inside an electronic component housing may be kept within favourable limits. In combination with gas moving devices, such as the above exemplified first and second fans, the temperature inside an electronic component housing is easily controlled.

The gas, e.g. air, inside the electronic component housing is circulated by the first fan, over the outer surface area of the evaporator and towards the electronic components. The speed of the first fan may suitably be controlled. Even though the first fan could be stopped at low temperatures inside the electronic component housing, it is suitable to maintain a minimum speed of the first fan e.g. to avoid local heat build up at electronic components.

In a first situation, when electronic components inside the electronic component housing generate heat to such an extent that the inside of the electronic component housing requires cooling, the refrigerant self-circulates in the refrigerant circuit and the second fan is controlled to blow air over the outer surface of the condenser to improve heat transfer from the condenser to the ambient environment. The volume of refrigerant in the reservoir for liquid refrigerant may be controlled. The heat exchange by means of the heat transfer arrangement may also in this way be adapted to a present cooling need.

In a second situation, e.g. when ambient temperature has fallen, a desired temperature may be maintained inside the electronic component housing by means of the heat transfer arrangement but without the aid of the second fan. The second fan is stopped to decrease the heat transfer between the condenser and the environment. The refrigerant still self-circulates in this situation and a desired temperature is maintained inside the electronic component housing. Still the volume of the refrigerant in the reservoir for liquid refrigerant may be controlled to provide required heat exchange by means of the heat transfer arrangement.

An additional or separate criterion for stopping the second fan may be when a temperature inside the electronic component housing is in the interval of +5 to +20 degrees Celsius.

In a third situation, e.g. when ambient temperature has fallen further, a desired temperature may be maintained inside the electronic component housing without the aid of the heat transfer arrangement. Heat exchange by means of the heat transfer arrangement is reduced to a minimum by means of the refrigerant reservoir for liquid reservoir containing a maximum amount of refrigerant.

According to example embodiments, inside a refrigerant circuit of a heat transfer arrangement there is a refrigerant. The refrigerant may be R134a which is a name for 1,1,1,2-Tetrafluoroethane, it has the chemical formula $CH_2FCF_3$. Purely as an example one suitable amount of refrigerant R134a inside the refrigerant circuit may be 500 grams to provide maximum heat transfer capacity of the heat transfer arrangement. If at 6 degrees Celsius it may be desired to reduce the heat transfer capacity of the heat transfer arrangement to a minimal capacity, then all liquid refrigerant at this temperature would need to be collected from the refrigerant circuit in the reservoir, which amount has a volume of about 392 cubic centimeters at this temperature. Thus, the control device would need to achieve a volume increase of about 392 cubic centimeters in the refrigerant chamber when the temperature inside the electronic component housing drops from e.g. 55 degrees Celsius to 6 degrees Celsius.

Example embodiments may be combined as understood by a person skilled in the art. It is also understood by those skilled in the art that first and second fans may be any other gas moving devices suitable for producing a flow of gas over an outer surface of an evaporator or condenser. It is also possible to omit the first and/or second fan. The respective medium surrounding the condenser and/or the evaporator, commonly air, would then flow over the outer surface of the condenser and or/evaporator due to natural convection. A heating apparatus may be arranged to heat the inside of the electronic component housing to avoid too low temperatures inside the electronic component housing. Heating could become necessary under certain ambient conditions even though heat exchange by means of the heat transfer arrangement from the electronic component housing is minimal. Good heat transfer between the reservoir for liquid refrigerant, in particular the control chamber part thereof, and the inside of electronic component housing may provide reliable control of the refrigerant chamber volume of the reservoir. To provide such good heat transfer the reservoir may be provided with fins on its outer surface. The reservoir for liquid refrigerant may be arranged partially inside and partially outside the electronic component housing, e.g. a control chamber portion of the reservoir may be arranged inside the electronic component housing. The entire reservoir for liquid refrigerant may alternatively be arranged outside the electronic component housing. The reservoir for liquid refrigerant may be provided with two connecting conduits instead of only one, a first conduit leading liquid refrigerant to the reservoir and a second conduit for leading liquid refrigerant from the reservoir. The control device may comprise valves arranged in the two conduits to control the amount of refrigerant in the reservoir. In case a control chamber containing a control medium is used in the reservoir for liquid refrigerant this control medium may be a different refrigerant with different properties than the refrigerant in the refrigerant circuit. In one alternative all of the control medium in the control chamber may be in liquid phase, i.e. taking up minimum volume in the reservoir at a temperature of about +5 degrees Celsius and all of the control medium may be in gas phase at a temperature of about +60 degrees Celsius to take up a maximum volume inside the reservoir. Alternatively, the reservoir may have a refrigerant chamber, which may be varied in size by means of a piston, which is movable inside the reservoir by means of an actuator. The actuator may be electric, hydraulic or pneumatic and forms part of the control device. The piston would be controlled to provide a large refrigerant chamber when there is little or no cooling need inside the electronic component housing and to provide a small refrigerant chamber when there is a cooling need inside the electronic component housing. The refrigerant circuit of the heat transfer arrangement may exchange heat with a secondary heat exchange system outside the electronic component housing and/or a further heat exchange system inside the electronic component housing. That is, the condenser of the refrigerant circuit may be cooled by a fluid which circulates in the secondary heat exchange system. In the same manner the evaporator inside the electronic component housing may be heated by means of a fluid circulating in the further heat exchange system, which fluid is adapted to transfer heat generated by the electronic components to the evaporator. Electronic components generating heat inside the electronic component housing may be arranged in close proximity with the evaporator of the refrigerant circuit to be cooled directly by means of the evaporator, i.e. without circulating air inside the electronic component housing transferring the generated heat to the evaporator.

Therefore, it is to be understood that the foregoing is illustrative of various example embodiments and is not to be limited to the specific embodiments disclosed and that modifications to the disclosed embodiments, combinations of features of disclosed embodiments as well as other embodiments are intended to be included within the scope of the appended claims.

The invention claimed is:

1. A heat transfer arrangement for heat exchange between an inside of an electronic component housing and an ambient environment, said heat transfer arrangement comprising:
a refrigerant circuit including an evaporator configured to be arranged inside said housing and to evaporate a self-circulating refrigerant, a condenser configured to be arranged outside said housing and to condense said refrigerant, a first conduit through which said refrigerant rises in gaseous form from said evaporator to said condenser, and a second conduit through which said refrigerant flows in liquid form from said condenser to said evaporator; and
a reservoir that is connected to said refrigerant circuit, that is configured to be arranged inside said housing to be directly affected by the temperature therein, and that comprises a refrigerant chamber and a control chamber separated by a movable partition, wherein said refrigerant chamber is configured to hold said refrigerant in liquid form, and wherein said control chamber is configured to hold a control medium that expands in volume at higher temperatures and contracts in volume at lower temperatures to thereby adjust the size of said control chamber, adjust the respective amounts of said refrigerant in the refrigerant chamber and the refrigerant circuit, and control the temperature inside said housing.

2. The heat transfer arrangement according to claim 1, wherein said reservoir is directly, or via a connecting conduit, connected to said condenser, to said second conduit, or to said evaporator.

3. The heat transfer arrangement according to claim 1, wherein said movable partition comprises a piston or a membrane configured to adjust a size of said refrigerant chamber.

4. The heat transfer arrangement according to claim 3, wherein the moveable partition is configured to adjust said size of said refrigerant chamber responsive to the expansion or contraction of said control medium in said control chamber.

5. The heat transfer arrangement according to claim 1, wherein said control medium is a liquid.

6. The heat transfer arrangement according to claim 1, wherein said control medium is a gas.

7. The heat transfer arrangement according to claim 1, wherein said reservoir is directly, or via a dedicated connecting circuit, connected to a lower end of said condenser.

8. An electronic component housing including a heat transfer arrangement for heat exchange between an inside of the electronic component housing and an ambient environment, said heat transfer arrangement comprising:
  a refrigerant circuit including an evaporator configured to be arranged inside said housing and to evaporate a self-circulating refrigerant, a condenser configured to be arranged outside said housing and to condense said refrigerant, a first conduit through which said refrigerant rises in gaseous form from said evaporator to said condenser, and a second conduit through which said refrigerant flows in liquid form from said condenser to said evaporator; and
  a reservoir that is connected to said refrigerant circuit, that is configured to be arranged inside said housing to be directly affected by the temperature therein, and that comprises a refrigerant chamber and a control chamber separated by a movable partition, wherein said refrigerant chamber is configured to hold said refrigerant in liquid form, and wherein said control chamber is configured to hold a control medium that expands in volume at higher temperatures and contracts in volume at lower temperatures to thereby adjust the size of said control chamber, adjust the respective amounts of said refrigerant in the refrigerant chamber and the refrigerant circuit, and control the temperature inside said housing.

9. The electronic component housing according to claim 8, wherein said reservoir is directly, or via a connecting conduit, connected to said condenser, to said second conduit, or to said evaporator.

10. The electronic component housing according to claim 8, wherein said movable partition comprises a piston or a membrane configured to adjust a size of said refrigerant chamber.

11. The electronic component housing according to claim 10, wherein the moveable partition is configured to adjust said size of said refrigerant chamber responsive to the expansion or contraction of said control medium in said control chamber.

12. The electronic component housing according to claim 8, wherein said control medium is a liquid.

13. The electronic component housing according to claim 8, wherein said control medium is a gas.

14. The electronic component housing according to claim 8, wherein said reservoir is directly, or via a dedicated connecting circuit, connected to a lower end of said condenser.

15. The electronic component housing according to claim 8, wherein the electronic component housing is part of a radio base station.

16. A method of controlling the extent of heat that is exchanged between an inside of an electronic component housing and an ambient environment by self-circulation of a refrigerant through an evaporator exposed to an interior temperature of the housing and a condenser external to the housing, the method comprising:
  controlling the amount of refrigerant in circulation through the evaporator by collecting a variable amount of refrigerant condensed by the condenser in a refrigerant chamber exposed to a control element that reduces the volume of the refrigerant chamber with increasing interior temperature and increases the volume of the refrigerant chamber with decreasing interior temperature;
  wherein the collecting comprises collecting a variable amount of refrigerant condensed by the condenser in a refrigerant chamber exposed to a control element that:
    with increasing interior temperature, reduces the volume of the refrigerant chamber and correspondingly increases the volume of an adjacent control chamber that is separated from the refrigerant chamber by a moveable partition and that holds the control element; and
    with decreasing interior temperature, increases the volume of the refrigerant chamber and correspondingly decreases the volume of the adjacent control chamber.

17. A heat transfer arrangement configured to control the extent of heat exchange between an inside of an electronic component housing and an ambient environment, said arrangement comprising:
  a refrigerant circuit configured to evaporate and condense a refrigerant as that refrigerant self-circulates between an evaporator inside said housing and a condenser outside said housing via first and second conduits; and
  a reservoir comprising a refrigerant chamber and a control chamber separated by a moveable partition, wherein the control chamber is configured to house a control medium that has a volume dependent on the temperature inside said housing and wherein the movable partition is configured to adjust the respective sizes of the refrigerant and control chambers responsive to volume changes in said control medium to thereby either collect said refrigerant in liquid form from said refrigerant circuit into said refrigerant chamber or to introduce said refrigerant in liquid form from said refrigerant chamber into said refrigerant circuit.

* * * * *